(12) United States Patent
Han

(10) Patent No.: US 11,744,087 B2
(45) Date of Patent: Aug. 29, 2023

(54) THREE-DIMENSIONAL RESISTIVE MEMORY DEVICE

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 238 days.

(21) Appl. No.: 16/915,752

(22) Filed: Jun. 29, 2020

(65) Prior Publication Data

US 2021/0210551 A1  Jul. 8, 2021

(30) Foreign Application Priority Data

Jan. 3, 2020 (KR) .................. 10-2020-0000715

(51) Int. Cl.
*H10B 63/00* (2023.01)
*H10N 70/00* (2023.01)

(52) U.S. Cl.
CPC .......... *H10B 63/845* (2023.02); *H10B 63/34* (2023.02); *H10N 70/066* (2023.02)

(58) Field of Classification Search
CPC .......... H01L 27/1128; H01L 27/11514; H01L 27/11597; H10B 20/50; H10B 53/20; H10B 51/20
See application file for complete search history.

(56) References Cited

U.S. PATENT DOCUMENTS

| 9,257,176 | B1 | 2/2016 | Park | |
|---|---|---|---|---|
| 9,859,337 | B2 | 1/2018 | Ratnam et al. | |
| 2010/0002516 | A1* | 1/2010 | Sim | H01L 27/11565 |
| | | | | 257/E21.409 |
| 2017/0103808 | A1* | 4/2017 | Franca-Neto | H01L 45/1246 |
| 2017/0250224 | A1* | 8/2017 | Ratnam | H01L 27/2454 |

OTHER PUBLICATIONS

Marc Bocquet et al., Compact Modeling Solutions for Oxide-Based Resistive Switching Memories (OxRAM), Journal of Low Power Electronics and Applications, Mar. 2014, ISSN 2079-9268, MDPI, Basel, Switzerland.

* cited by examiner

*Primary Examiner* — Amar Movva
(74) *Attorney, Agent, or Firm* — William Park & Associates Ltd.

(57) ABSTRACT

A resistive memory device includes a vertical word line pillar, a plurality of resistive layers, a gate insulation layer, and a channel layer. The vertical word line pillar is formed on a semiconductor substrate. The resistive layers are stacked at both sides of the vertical word line pillar. The gate insulation layer is interposed between the vertical word line pillar and the resistive layers. The channel layer is arranged between the gate insulation layer and the resistive layers.

10 Claims, 23 Drawing Sheets

FIG.1
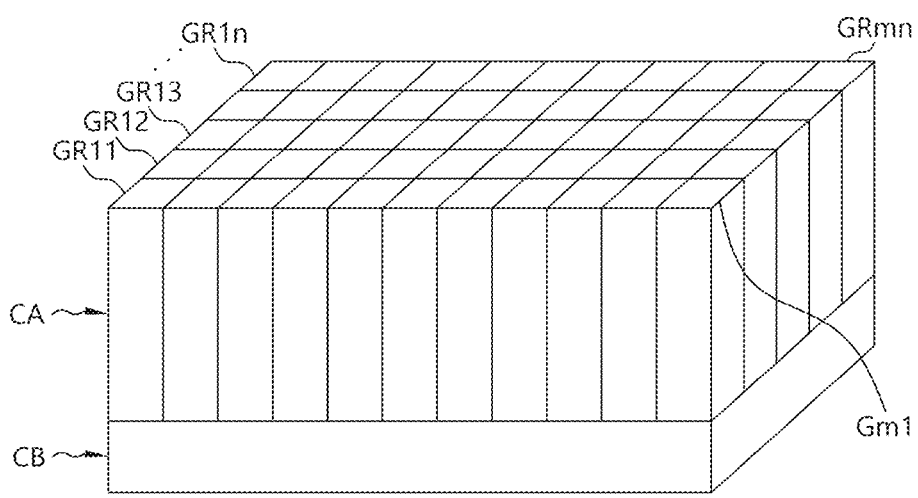
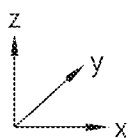

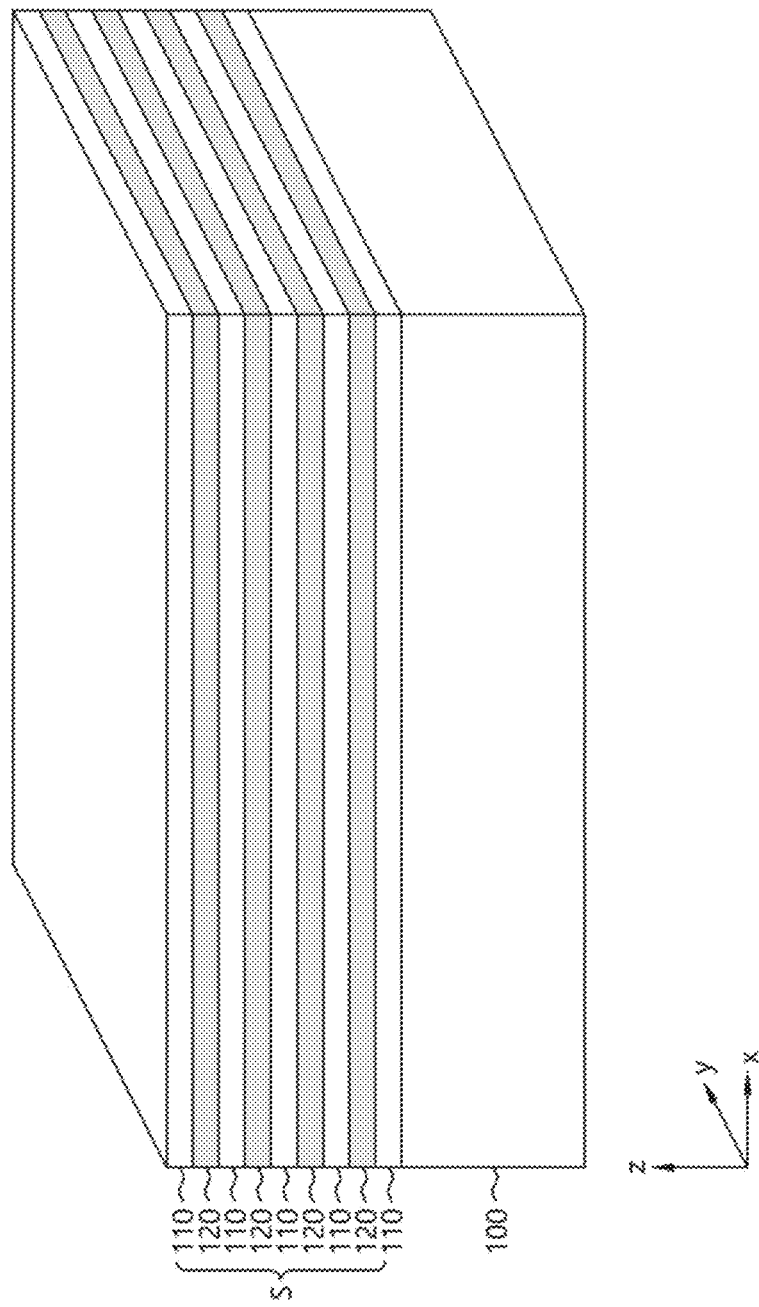

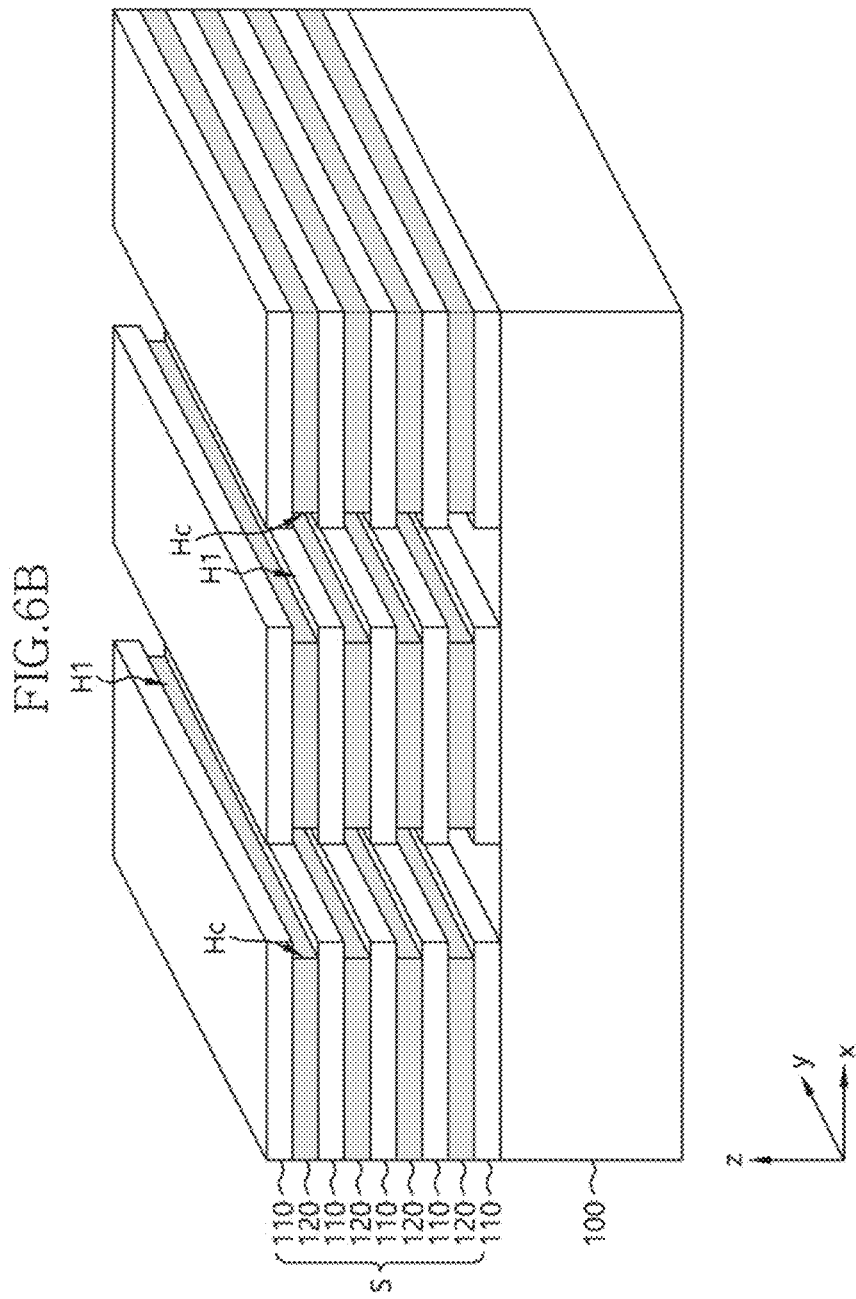

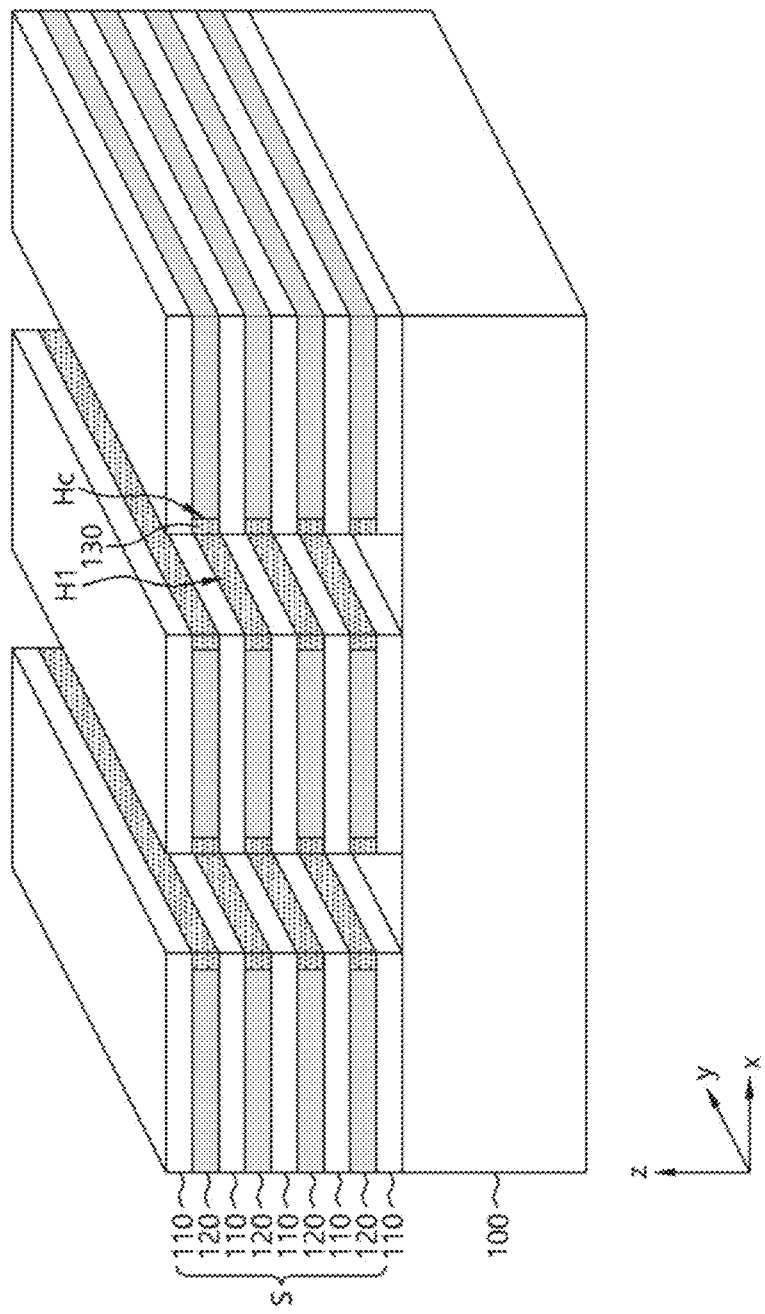

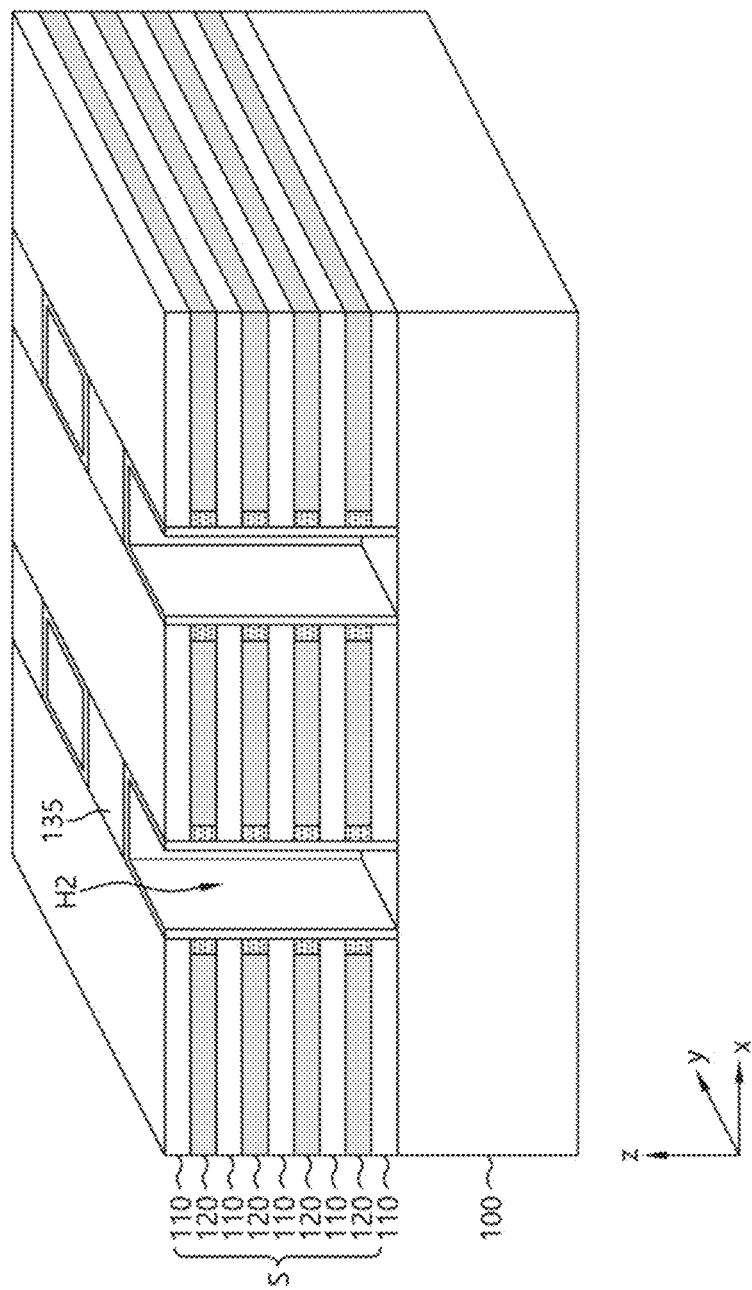

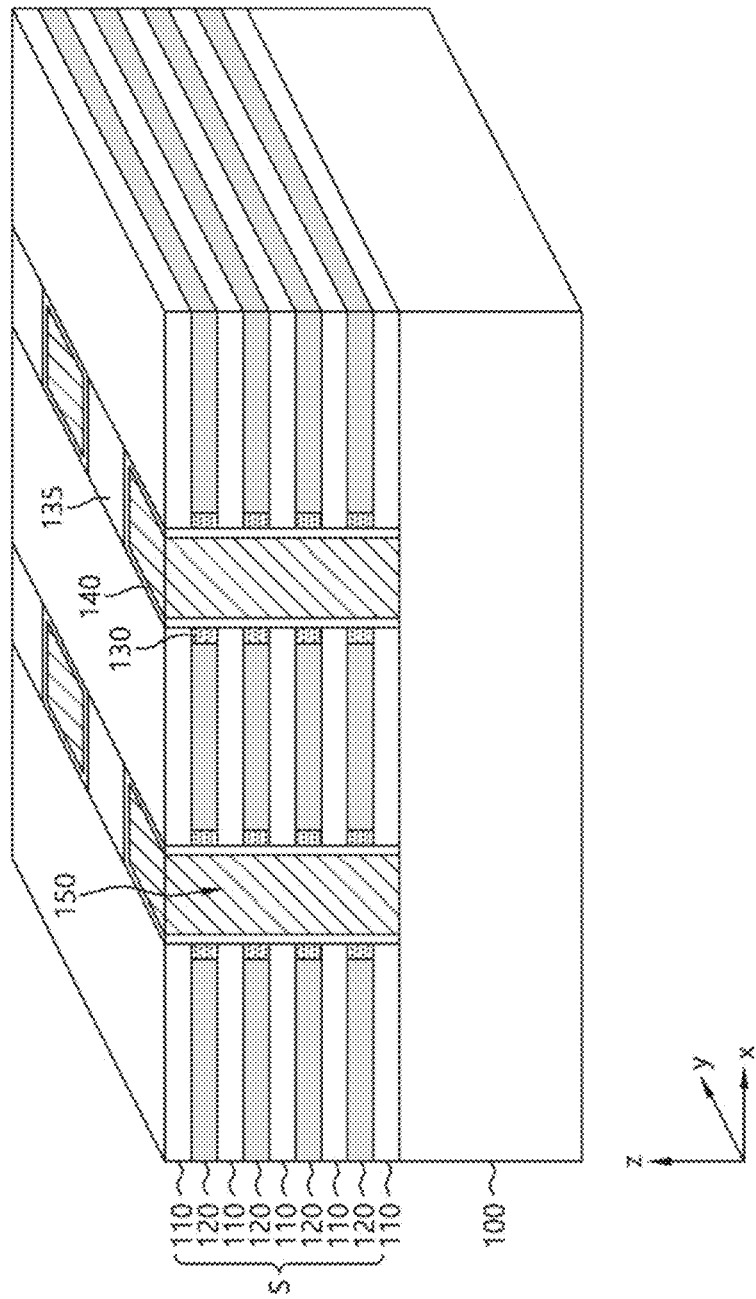

THREE-DIMENSIONAL RESISTIVE MEMORY DEVICE

CROSS-REFERENCES TO RELATED APPLICATION

The present application claims priority under 35 U.S.C. § 119(a) to Korean application number 10-2020-0000715, filed on Jan. 3, 2020, in the Korean Intellectual Property Office, which is incorporated herein by reference in its entirety.

BACKGROUND

1. Technical Field

Various embodiments may generally relate to a nonvolatile memory device, and more particularly, to a three-dimensional resistive memory device.

2. Related Art

In order to achieve good performance at low cost, it may be required to increase a degree of integration for a semiconductor memory device. Because the degree of integration for the semiconductor memory device may be an important factor for determining the price of an electronic device, an increased degree of integration may be required.

In a two-dimensional or a planar semiconductor memory device, a degree of integration for the two-dimensional or the planar semiconductor memory device may be determined in accordance with an occupying area of a unit memory cell so that the degree of integration may be greatly influenced by a level of a technology for forming a fine pattern. However, because the fine pattern may be formed using semiconductor fabrication apparatuses having high cost, the degree of integration for the two-dimensional semiconductor memory device may be restricted.

In order to overcome the restriction, a three-dimensional semiconductor memory device including three-dimensionally arranged memory cells may be proposed.

Recently, numbers of memory transistors in a string of a non-volatile memory device may be remarkably increased so that a height of the three-dimensional stacked memory device may also be remarkably increased. When the height of the three-dimensional stacked memory device may be increased, it may be difficult to form a channel layer and a slit.

SUMMARY

In example embodiments of the present disclosure, a three-dimensional resistive memory device may include a vertical word line pillar, a plurality of resistive layers, an insulation layer, a gate insulation layer, and a channel layer. The vertical word line pillar may be formed on a semiconductor substrate. The resistive layers may be sequentially stacked at both sides of the vertical word line pillar. The insulation layers may be alternately stacked with the resistive layers. The gate insulation layer may be interposed between the vertical word line pillar and the resistive layers. The channel layer may be arranged between the gate insulation layer and the resistive layers.

In example embodiments of the present disclosure, a three-dimensional resistive memory device may include a semiconductor substrate, a single word line pillar, a gate insulation layer, a plurality of resistive layers, a channel layer and a plurality of bit lines. The semiconductor substrate may include a plurality of memory group regions in row and column directions. The single word line pillar may be vertically extended from an upper surface of the semiconductor substrate in each of the memory group regions. The gate insulation layer may be configured to surround a sidewall of the word line pillar. The resistive layers may be vertically stacked at both sides of the word line pillar. The channel layer may be interposed between the resistive layers and the gate insulation layer. The bit lines may be electrically connected with the resistive layers.

In example embodiments of the present disclosure, a three-dimensional resistive memory device may include memory groups arranged in row and column directions. Each of the memory groups may include one word line, a plurality of bit lines intersected with the word line, and a plurality of memory cells connected between the word line and the bit lines. Each of the memory cells may include a switching element configured to be turned-on in response to a voltage of the word line, and a variable resistor connected in parallel with the switching element.

In example embodiments of the present disclosure, a three-dimensional resistive memory device may include a pair of bit line structures, a plurality of word lines, and memory cells. The bit line structures may be extended in a column direction. The word lines may be spaced apart from each other by a uniform gap. The word lines may extend in a vertical direction to intersect with the bit line structures. The memory cells may be arranged at intersection points between the word lines and the bit line structures. Each of the memory cells may include a switching element configured to be turned-on in response to a voltage of the word line, and a variable resistor connected in parallel with the switching element and electrically connected with the bit line structures.

According to example embodiments, the resistive layers may be stacked in place of word lines and word lines may be vertically formed. The resistive layers having a thin thickness may have variable resistors differently from the word line having a thick thickness for having a wiring resistance so that the three dimensional-resistive memory device may have a low height.

BRIEF DESCRIPTION OF THE DRAWINGS

The above and another aspects, features, and advantages of the subject matter of the present disclosure will be more clearly understood from the following detailed description taken in conjunction with the accompanying drawings, in which:

FIG. 1 is a perspective view illustrating a three-dimensional resistive memory device in accordance with example embodiments;

FIGS. 6A to 6E are perspective views illustrating a method of manufacturing a three-dimensional resistive memory device in accordance with example embodiments;

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the inventive concept. Although a few embodiments of the present teachings will be shown and described, it will be appreciated by those of ordinary skill in the art that changes may be made in these embodiments without departing from the principles and spirit of the present teachings.

FIG. 1 is a perspective view illustrating a three-dimensional resistive memory device in accordance with example embodiments.

Referring to FIG. 1, a three-dimensional resistive memory device 10 of example embodiments may include a memory cell array CA and a control circuit block CB. For example, the memory cell array CA may be stacked on the control circuit block CB.

The memory cell array CA may include a plurality of word lines, a plurality of bit lines, and a plurality of memory cells. The memory cell array CA may be classified into memory groups GR11~GRmn based on the word lines. Each of the memory groups GR11~GRmn may be electrically connected with the control circuit block CB. The memory groups GR11~GRmn may be independently operated. As used herein, the tilde "~" indicates a range of components. For example, "GR11~GRmn" indicates the memory groups GR11, GR12, . . . , GRmn–1, and GRmn shown in FIG. 1.

Although not depicted in drawings in detail, the control circuit block CB may include a control logic, a voltage generation circuit, a read/write circuit, and a decoding circuit configured to drive the memory groups GR11~GRmn.

Figure 2A:
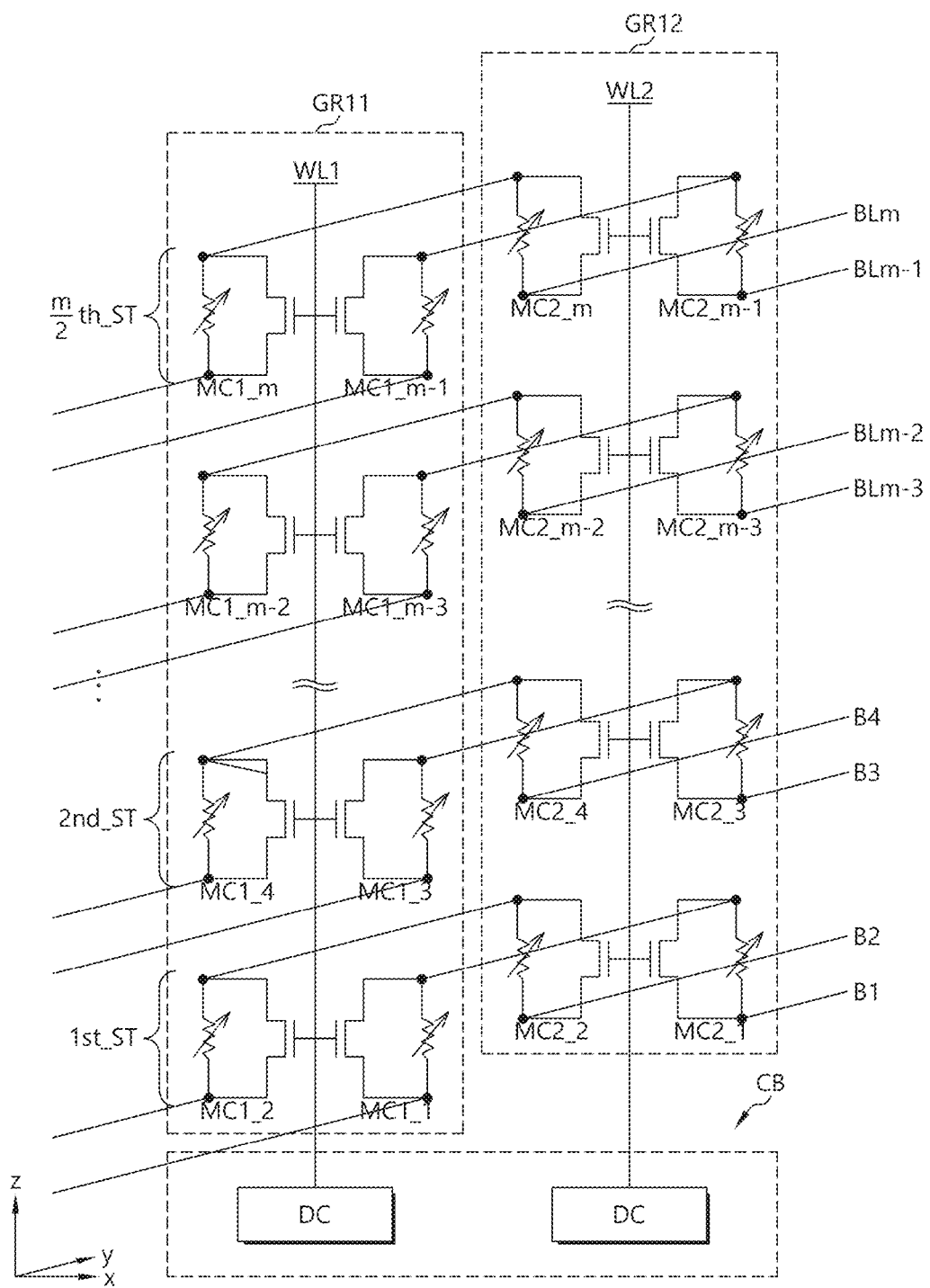
FIGS. 2A and 2B are circuit diagrams illustrating a memory group of a three-dimensional resistive memory device in accordance with example embodiments.
Figure 2B:
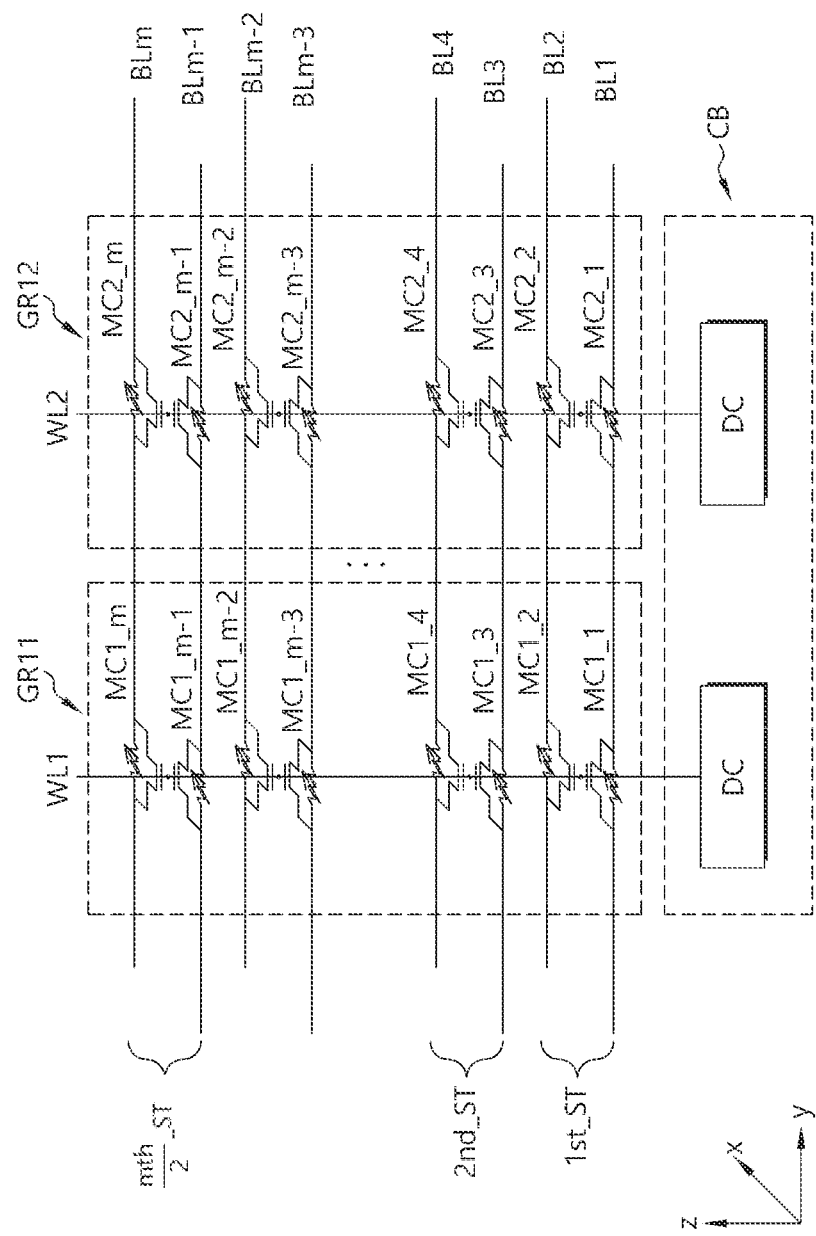

FIGS. 2A and 2B is a circuit diagram illustrating a memory group of a three-dimensional resistive memory device in accordance with example embodiments. For conveniences of explanations, a first memory group GR11 and a second memory group GR12 among the memory groups GR11~GRmn may be illustrated.

Referring to FIGS. 2A and 2B, each of the first and second memory group GR11 and GR12 may include word lines WL1 and WL2 a plurality of bit lines BL1 to BLm, and a plurality of memory cells MC1_1~MC1_$m$ and MC2_1~MC2_$m$.

The word lines WL1 and WL2 may be allotted to the memory groups GR11 and GR12, respectively. The word lines WL1 and WL2 may be extended in a z-direction of FIGS. 2A and 2B, i.e., a direction substantially perpendicular to a surface of a semiconductor substrate. Each of the word lines WL1 and WL2 may be connected to a decoding circuit DC of the control circuit block CB to be selectively enabled. The bit lines BL1 to BLm may be stacked in units of two bit lines. The memory cells MC1_1~MC1_$m$ and MC2_1~MC2_$m$ may be stacked in the z-direction and connected with the word lines in the memory groups GR11 and GR12. For example, the memory cells MC1_1~MC1_$m$ and MC2_1~MC2_$m$ in any one of the memory groups GR11 and GR12 may form pairs based on the word line. The pairs of the memory cells MC1_1~MC1_$m$ and MC2_1~MC2_$m$ may be stacked.

For example, in the first memory group GR11, a first memory cell MC1_1 connected to a first bit line BL1 and a second memory cell MC1_2 connected to a second bit line BL2 may be connected to the first word line WL1, respectively. The first and second memory cells MC1_1 and MC1_2 may be connected with each other to form the first stack layer $1^{st}$_ST.

A third memory cell MC1_3 connected to a third bit line BL3 and a fourth memory cell MC1_4 connected to a fourth bit line BL4 in the first memory group GR11 may be connected to the first word line WL1, respectively. The third and fourth memory cells MC1_3 and MC1_4 may be connected with each other to form a second stack layer $2^{nd}$_ST on the first stack layer $1^{st}$_ST. The number of stack layers may be set in consideration of the number of memory cells in the above-indicated manners.

In example embodiments, the memory cells MC1_1~MC1_$m$ and MC2_1~MC2_$m$ in each of the memory groups GR11 and GR12 may be commonly connected to the word lines WL1 and WL2, respectively. Thus, the memory groups GR11 and GR12 of example embodiments may be interpreted as a vertical page.

Further, a pair of memory cells which make up a stack layer in each of the memory groups GR11 and GR12 may be connected to different bit lines BL1~BLm, respectively. The bit lines BL1~BLm may be intersected with the word lines WL1 and WL2. The bit lines BL1~BLm may be connected to the stacked memory cells MC1_1~MC1_$m$ and MC2_1~MC2_$m$. For example, the bit lines BL1~BLm may be extended in a y-direction, i.e., a column direction.

For example, first and second bit lines BL1 and BL2 may be extended on the first stack layer 1$^{st}$_ST in parallel. The first and second bit lines BL1 and BL2 may be connected to the first and second memory cells MC1_1 and MC1_2, respectively. Third and fourth bit lines BL3 and BL4 may be extended on the second stack layer 2$^{nd}$_ST in parallel. The third and fourth bit lines BL3 and BL4 may be connected to the third and fourth memory cells MC1_3 and MC1_4, respectively.

Each of the bit lines BL1~BLm may be electrically connected with the memory cells positioned on a same column and a same level (i.e., a same stack layer). For example, first memory cells MC1_1~MCn_1 of the memory groups GR11~GR1n on a first column may be connected to the first bit line BL1 in common.

Figure 3:
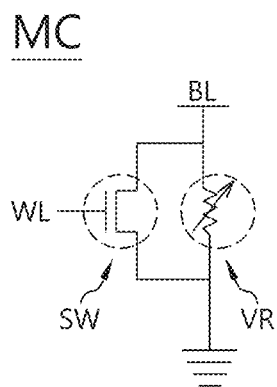
FIG. 3 is a circuit diagram illustrating a unit memory cell of a three-dimensional resistive memory device in accordance with example embodiments.

FIG. 3 is a circuit diagram illustrating a unit memory cell of a three-dimensional resistive memory cell in accordance with example embodiments.

Referring to FIG. 3, the memory cells MC may include a switching element SW and a variable resistor VR.

For example, the switching element SW may include a vertical transistor having a vertical channel. For example, the switching element SW may include a TFT (Thin film transistor). The switching element SW may be turned-on in accordance with voltage levels of the word line WL to switch a voltage of the bit line BL.

The variable resistor VR may be connected with the switching element SW in parallel. For example, the variable resistor VR may be connected between a source and a drain of the switching element SW, i.e., with a channel layer of the switching element SW, in parallel. When a voltage difference between one terminal of the variable resistor VR and the other terminal of the variable resistor VR may be a threshold voltage or more, the variable resistor VR may be turned on. A resistance of the variable resistor VR when the variable resistor is turned-on, is lower than an off-resistance of the switching element SW and higher than an on-resistance of the switching element SW.

The switching element SW and the variable resistor VR may be connected between the bit line BL and a ground (or a source electrode) in common.

When a write voltage (or a write current) is applied to the bit line BL and the word line WL is enabled, the switching element SW may be turned-on by a voltage difference between a voltage level of the word line WL and a voltage level of the bit line BL. Thus, the write voltage (or the write current) applied to the bit line BL may be transmitted to a memory cell on a next group through the channel layer of the switching element SW.

When the word line WL is disabled while the write voltage (or the write current) is applied to the bit line BL, the switching element SW may be turned-off. However, the voltage difference may be generated between the one terminal of the variable resistor VR and the other terminal of the variable resistor VR by a threshold voltage of the variable resistor VR. Thus, the variable resistor VR may be turned on. And then, the write voltage (or the write current) may be provided to the turned on variable resistor VR. A resistance of the turned-on variable resistor VR may be changed according to the write voltage (or the write current), to be lower than the off-resistance of the switching element SW.

The voltage or the current applied to the bit line BL may be transmitted to a memory cell on a next group through the variable resistor VR connected with the switching element SW, in parallel, without going through the switching element SW. During transmitting the voltage or the current, data may be stored (or written or programed) in the variable resistor VR.

Figure 4:
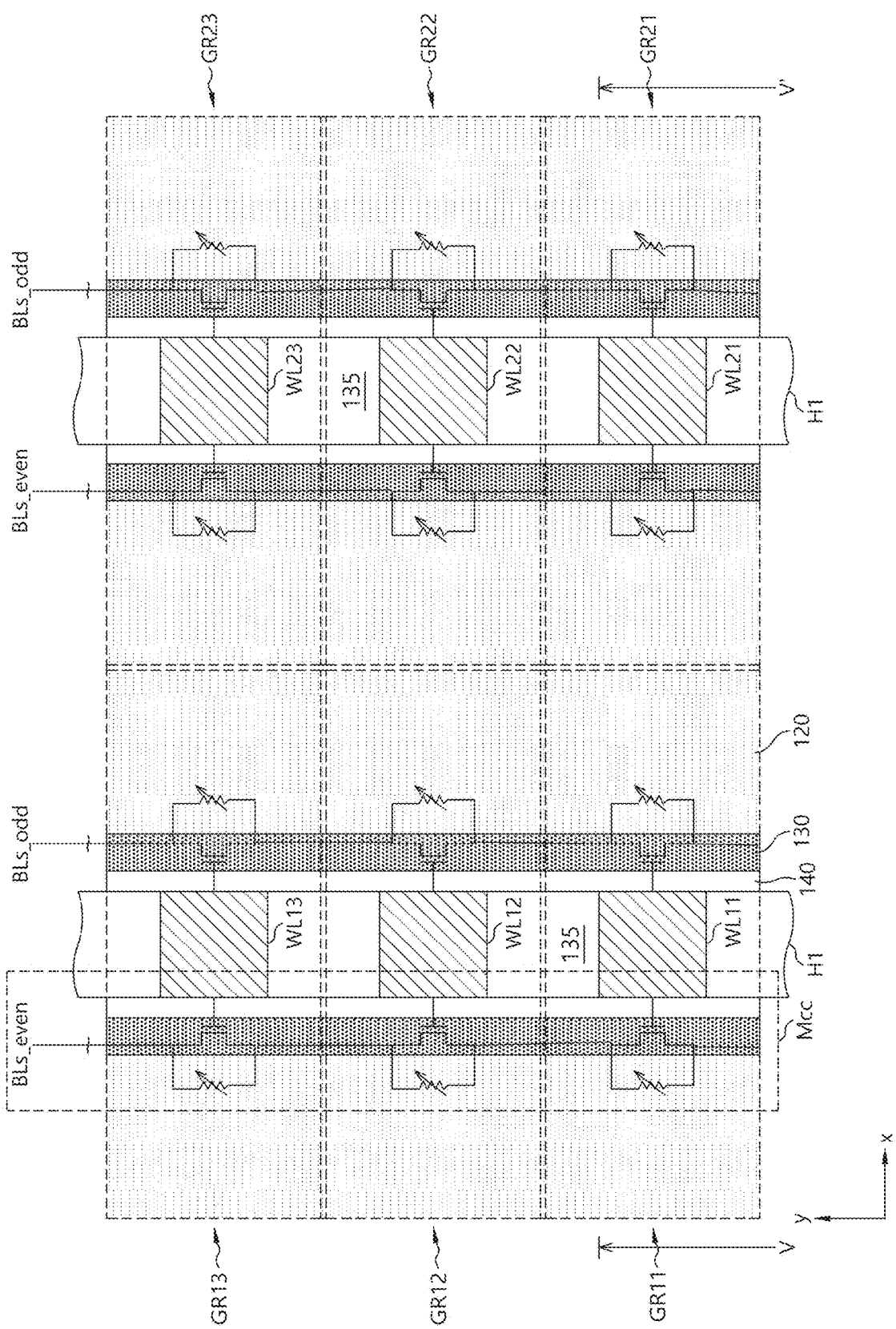
FIG. 4 is a plan view illustrating a memory group in accordance with example embodiments.

FIG. 4 is a plan view illustrating a memory group in accordance with example embodiments. For example, FIG. 4 shows a one stack layer of the memory groups.

Referring to FIG. 4, the memory groups GR11~GR12 may be arranged in a matrix shape.

The word lines WL11~WL23 may be arranged in each of the memory groups GR11~GR23.

Resistive layers 120 may be arranged at both ends of the word lines WL11~WL23 in the x-direction. Each of the resistive layers 120 may be extended in the y-direction (column direction) without disconnection. For example, the resistive layers 120 may correspond to the variable resistor VR of the FIG. 2A and FIG. 2B.

A gate insulation layer 140 and a channel layer 130 may be interposed between the word lines WL11~WL23 and the resistive layers 120. For example, the gate insulation layer 140 may be formed between the word lines WL11~WL23 and the channel layer 130. The channel layer 130 may be formed between the gate insulation layer 140 and the resistive layers 120.

The channel layer 130 may be extended in the y-direction (column direction) without disconnection similarly with the resistive layer 120.

The word lines WL11~WL23 on a same column may be electrically isolated from each other by an insulating interlayer 135.

The resistive layer 120 and the channel layer 130 may be electrically connected to bit lines BLs_even and BLs_odd. For example, the resistive layer 120 and the channel layer 130 positioned at a left side (or one side) of the word lines WL11~WL23 may be connected to one of the even bit lines BLs_even. The resistive layer 120 and the channel layer 130 positioned at a right side (or the other side) of the word lines WL11~WL23 may be connected to one of the odd bit lines BLs_odd.

In example embodiments, the memory cells MC, which may be positioned on the same column and connected to the same bit line, may correspond to a memory string of a general NAND Flash memory.

For example, when a memory operation of a selected memory cell in the memory cells MC of the memory string may be performed, a word line connected the selected memory cell may be disabled and the rest of the word lines may be enabled. A write voltage and/or a write current for the memory operation may then be applied to a bit line connected to the selected memory cell. Thus, the switching elements of the rest of the memory cells except for the selected memory cell may be turned-on and only the switching element of the selected memory cell may be turned-off.

Therefore, the write voltage (and/or write current) of the bit line may be transmitted to the switching elements SW of the non-selected memory cells and the resistive layer 120 (i.e., variable resistor) of the selected memory cell so that the memory operation may be performed on the resistive layer 120 (i.e., variable resistor) of the selected memory cell.

FIGS. 5A to 5E are cross-sectional views illustrating a method of manufacturing a three-dimensional resistive memory device in accordance with example embodiments, and FIGS. 6A to 6E are perspective views illustrating a method of manufacturing a three-dimensional resistive memory device in accordance with example embodiments. For example, FIGS. 5A to 5E and FIGS. 6A to 6E show two adjacent memory groups positioned in a same row. Further, FIGS. 5A to 5E are cross-sectional views taken along a line V-V' in FIG. 4.

Figure 5A:
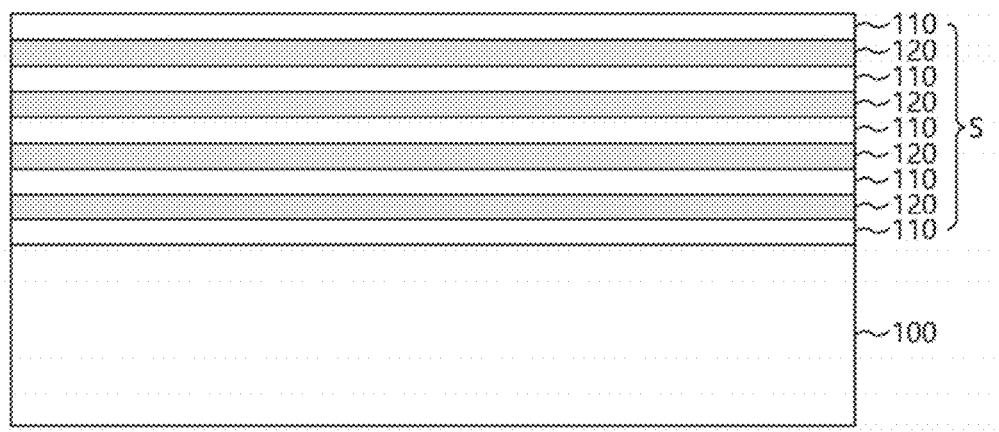
FIGS. 5A to 5E are cross-sectional views illustrating a method of manufacturing a three-dimensional resistive memory device in accordance with example embodiments.

Referring to FIGS. 5A and 6A, a semiconductor substrate 100 with device layers may be provided. For example, the semiconductor substrate 100 may include impurity regions. The device layers may include a control circuit for driving memory devices, for example, a layer in which transistors including decoding circuits may be integrated.

An insulation layer 110 and a resistive layer 120 may be alternately stacked on the semiconductor substrate 100 to form a stack structure S. For example, the insulation layer 110 may include a silicon oxide layer, a silicon nitride layer, etc., not restricted to a specific insulation material. The resistive layer 120 may have a resistance value changed in accordance with various electrical conditions. The resistive layer 120 may correspond to the variable resistor VR in FIG. 3. The resistive layer 120 of example embodiments may include a chalcogenide compound, a transition metal compound, a ferroelectric, a ferromagnetic substance, etc., not restricted within a specific material. For example, the resistive layer 120 may include metal oxide. The metal oxide may include transition metal oxide such as nickel oxide, titanium oxide, hafnium oxide, zirconium oxide, tungsten oxide, cobalt oxide, etc., a perovskite material such as STO (SrTiO), PCMO (PrCaMnO), etc.

Further, the resistive layer 120 may include a phase change material. The phase change material may include a chalcogenide material such as GST (Ge—Sb—Te). The resistive layer 120 may be stabilized into any one a crystalline state or an amorphous state by a heat to represent switching characteristics between different resistance states.

The resistive layer 120 may include a structure having a tunnel barrier layer interposed between two magnetic layers. The magnetic layer may include NiFeCo, CoFe, etc. The tunnel barrier layer may include $Al_2O_3$, etc. The resistive layer 120 may have switching characteristics between different resistance states in accordance with magnetization directions of the magnetic layer. For example, when the magnetization directions of the two magnetic layers are parallel to each other, the resistive layer 120 may have a low resistance state. In contrast, when the magnetization directions of the two magnetic layers are anti-parallel to each other, the resistive layer 120 may have a high resistance state.

The resistive layer 120 may have a thickness for performing a resistance change operation. For example, the resistive layer 120 may have a minimum thickness for performing the resistance change operation. The insulation layer 110 may have a thickness for electrically isolating the resistive layer 120.

The stack structure S may have a height lower than that of a NAND flash structure, which may include stacked word lines, having the same number of layers substantially the same as those of the stack structure S.

As indicated above, the NAND flash memory may include the stacked word lines. In order to provide the word lines with signal transmission characteristics, i.e., the wiring resistance, the word lines may have a thick thickness. Thus, a height of the NAND flash memory structure may be limited without decreasing the stacked numbers of the word lines.

In contrast, the resistive layer 120 may have a minimum thickness, for example, of about several nanometers for performing the resistance change operation differently from the word lines so that the resistive layer 120 may have a thickness less than that of the word line.

As a result, when the stacked numbers of layers of the stack structure S and the NAND flash memory may be same, the height of the stack structure S may be lower than that of the NAND flash memory.

In example embodiments, the insulation layer 110 and the resistive layer 120 may be alternately stacked on the semiconductor substrate 110 to form the stack structure S. The insulation layer 110 may be stacked on an uppermost surface of the stack structure S. Alternatively, when an insulation layer is formed on the device layer, the resistive layer 120 and the insulation layer 110 may be alternately stacked to form a stack structure.

Figure 5B:
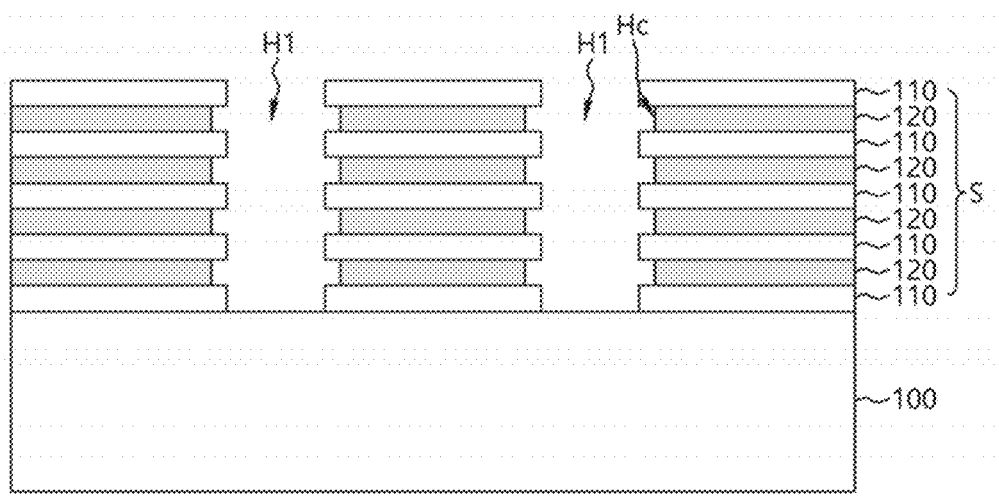

Referring to FIGS. 4, 5B and 6B, the stack structure S may be etched to form a first hole H1. The first hole H1 may have a linear shape configured to expose the semiconductor substrate 110. The first hole H1 may be extended in the column direction of FIG. 4. The first hole H1 may be formed by anisotropically etching the insulation layer 110 and the resistive layer 120. An etchant for over-etching the resistive layer 120 compared to the insulation layer 110 may be used in the etching process for forming the first hole H1. Thus, the resistive layer 120 may be over-etched compared to the insulation layer 110 to form a channel groove Hc at a region where the resistive layer 120 may be formed.

In example embodiments, after forming the first hole H1, the resistive layer 120 exposed through the first hole H1 may be additionally etched to form the channel groove Hc at the region where the resistive layer 120 may be formed.

Figure 5C:
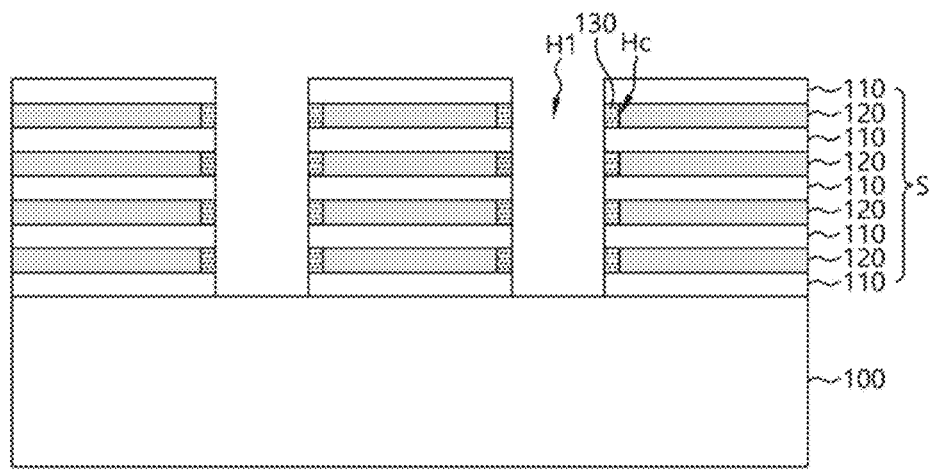

Referring to FIGS. 5C and 6C, a channel layer 130 may be formed in the channel groove Hc. The channel layer 130 may include at least one of a doped polysilicon layer, a silicon oxide layer, a carbon nano tube layer, a Grapheme layer, a transition metal dichalcogenide monolayers and a $MoS_2$ layer. For example, the channel layer 130 may include a material used as a channel of the TFT, such as, an amorphous silicon layer. In addition, the channel layer 130 may include a material with Indium, Gallium, Zinc and Oxygen, i.e., IGZO, which is a channel of an oxide TFT. For example, the channel layer 130 may have a uniform thickness. The channel layer 130 may be formed on a surface of the stack structure having the first hole H1. The uniform thickness of the channel layer 130 may correspond to bury the channel groove Hc. The channel layer 130 may be anisotropically etched to fill the channel groove Hc with the channel layer 130. Thus, the channel layer 130 may be configured to make contact with each of the resistive layers 120 of the stack structure S. The channel layer 130 may be extended in the y-direction.

Figure 5D:
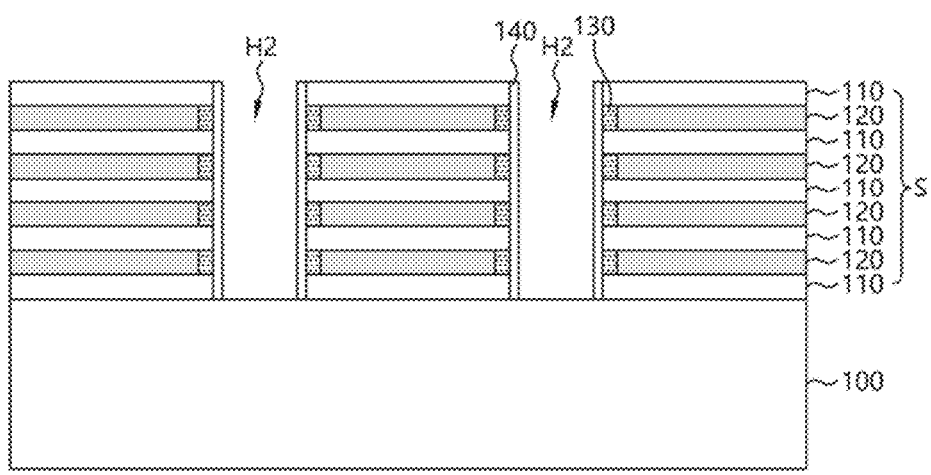

Referring to FIGS. 5D and 6D, the first hole H1 may be filled with an insulating interlayer 135. The insulating interlayer 135 in the first hole H1 may be etched to form a plurality of second holes H2. The second holes H2 may have a pattern shape.

A gate insulation layer 140 may be formed on an inner surface of the second holes H2. For example, the gate insulation layer 140 may be anisotropically treated to expose the semiconductor substrate 100 on a bottom surface of the second holes H2.

In example embodiments, the gate insulation layer 140 may include a silicon oxide layer, not restricted to a specific insulation material.

Figure 5E:
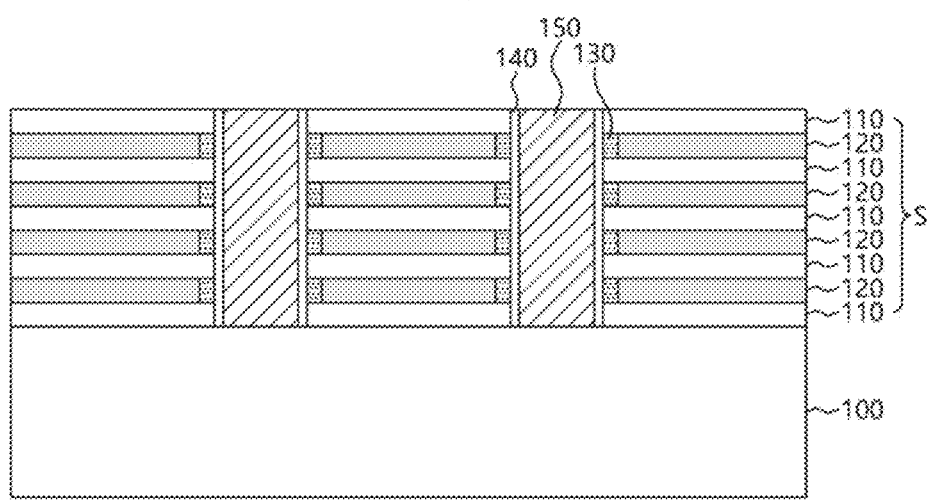

Referring to FIGS. 5E and 6E, the second holes H2 may be filled with a conductive layer to form a word line pillar 150. The conductive layer of the word line pillar 150 may include a metal layer, for example, a tungsten layer having good gap-filling characteristics. The word line pillar 150 may correspond to the word line positioned in one memory group in FIGS. 2A and 2B and 4.

Although not depicted in drawings, the word line pillar 150 may be connected to the control circuit block in the device layer of the semiconductor substrate 100 to receive an enable voltage. Further, the word line pillar 150 may receive the enable voltage through an additional contact line. The word line WL may have an upper surface configured to make contact with a voltage line.

Figure 7:
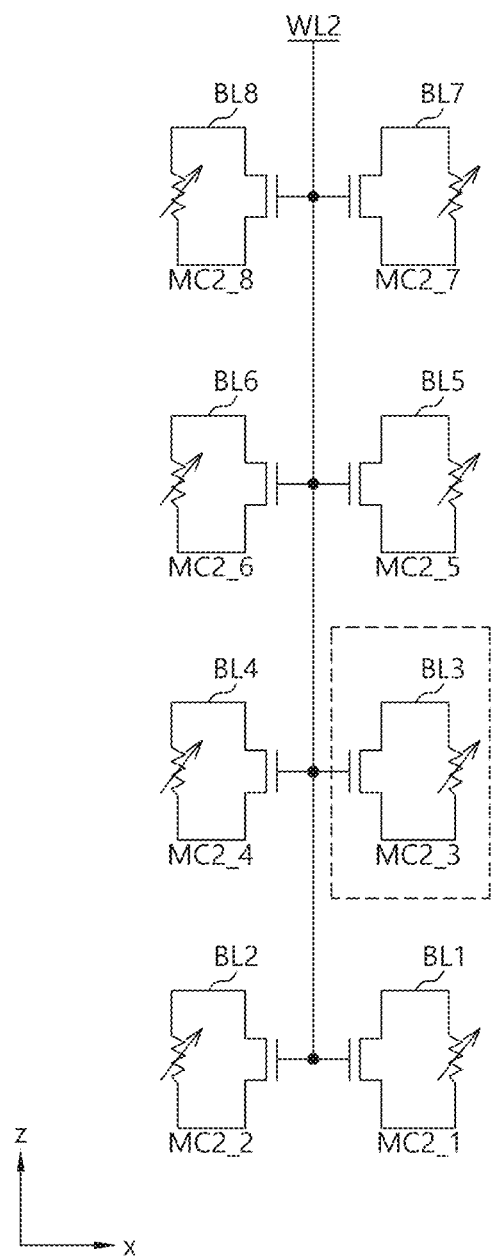
FIGS. 7 and 8 are circuit diagrams illustrating a program operation of a three-dimensional resistive memory device in accordance with example embodiments.
Figure 8:
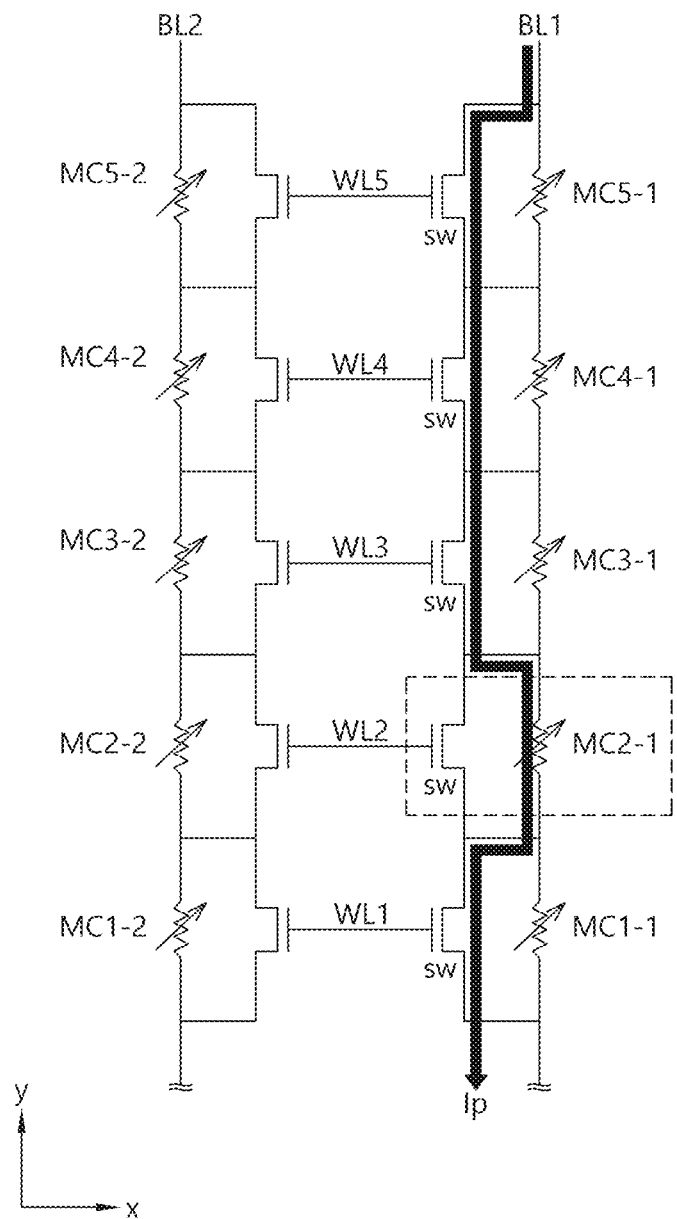

FIGS. 7 and 8 are circuit diagrams illustrating a program operation of a three-dimensional resistive memory device in accordance with example embodiments. FIG. 7 is an equivalent circuit diagram illustrating memory cells by a page unit connected to one word line. FIG. 8 is an equivalent circuit diagram illustrating memory cells by a string unit connected to a pair of bit lines.

For conveniences of explanations, one page may include 8 memory cells and one string may include five memory cells.

Further, memory operations, i.e., a program operation, a read operation, and an erase operation of the memory cell with respect to a memory cell MC2_1 between the second word line WL2 and the first bit line BL1 may be illustrated.

Referring to FIGS. 7 and 8, an enable voltage may be applied to remaining word lines WL and WL3~WL5 (hereinafter, referred to as non-selected word line) except for the second word line WL2 (hereinafter, referred to as selected word line) connected to the memory cell MC2_1 to be selected.

A write (or program) voltage and a write current Ip may be applied to the first bit line BL1 (hereinafter, referred to as a selected bit line) connected with the memory cell MC2_1 to be selected.

The write voltage and the write current Ip may have levels for changing the variable resistor VR, i.e., properties of the resistive layer 120.

An enable voltage is applied to the non-selected word lines WL1 and WL3~WL5. The switching elements SW of the memory cells connected with the non-selected word lines WL1 and WL3~WL5 may be turned-on by the enable voltage. For example, the enable voltage may have a level of no less than that of the threshold voltage of the switching element in the memory cell MC2_1. The memory cells MC2_1~MC2_8 connected to the selected word line WL2 may be turned-off.

Therefore, the write current Ip transmitted through the selected bit line BL1 may flow through the channel layer of the switching element SW of the memory cells MC5_1, MC4_1 and MC3_1 connected between the selected bit line BL1 and the non-selected word lines WL3~WL5. In contrast, the switching element SW of the memory cell MC2_1 connected between the selected bit line BL1 and the selected word line WL2 may be turned-off, because the selected word line WL2 is disabled. At that time, one terminal of the variable resistor VR connected to the memory cell MC3_1 has a level of the write voltage and the other terminal of the variable resistor VR connected to the memory cell MC1_1 has a level of a ground voltage. Thus, the variable resistor VR is turned on by a voltage difference between the one terminal thereof and the other terminal thereof.

The turned-on variable resistor VR includes a resistance lower than an off-resistance of the switching element SW. However, the resistance of the turned-on variable resistor VR is higher than an on-resistance of the switching element SW. The write voltage and/or write current Ip may flow through the turned-on variable resistor VR having a resistance lower than the off-resistance of the switching element SW, because the switching element SW of the memory cell MC2_1 has the off-resistance. During the above-indicated processes, the resistance state of the variable resistor VR may be changed by the write voltage and/or write current Ip to perform the write (program) operation. Thus, data is stored in the variable resistor VR. Resistance states (or levels) of the variable resistor VR may be changed by a write voltage and a write current application method.

In example embodiments, the write current may flow through the variable resistor parallelly connected to the disabled switching element, and the variable resistor is written (programmed). The write voltage and write current may change the property of the variable resistor (i.e., resistive layer) to form a filament parallelly connected with the switching element.

A current having an opposite polarity to the write current may be applied to the selected memory cell MC2_1 to ease the data in the memory cell MC2_1.

Figure 9:
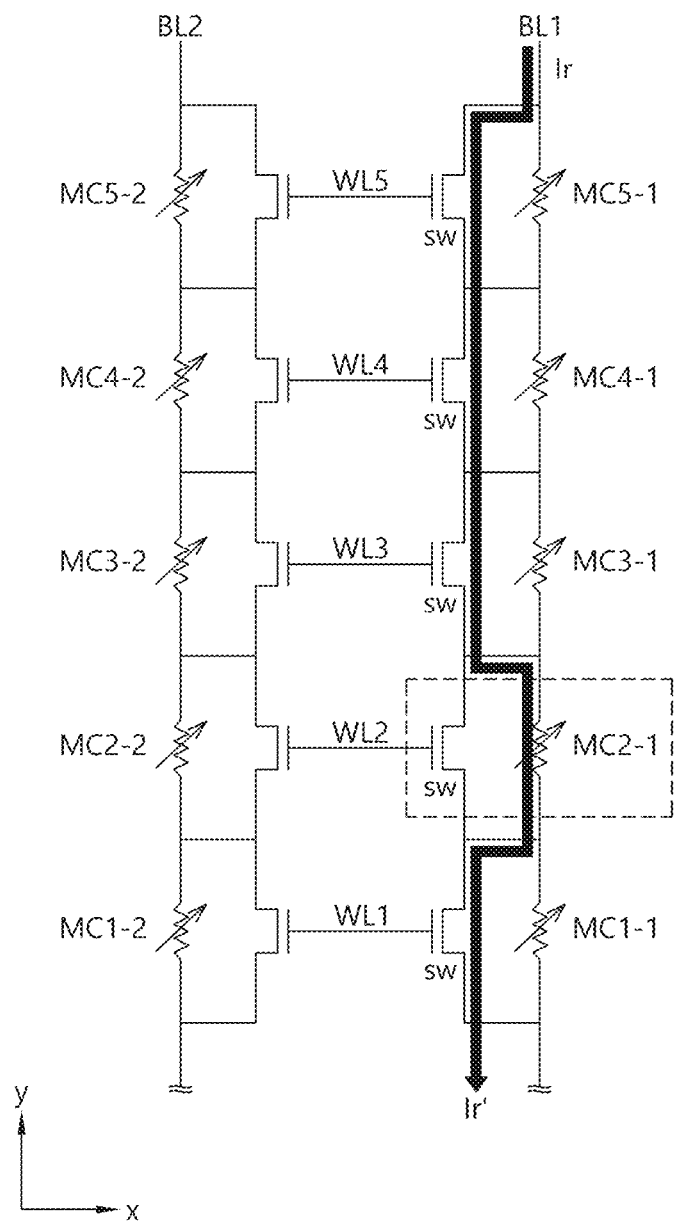
FIG. 9 is a circuit diagram illustrating a read operation of a three-dimensional resistive memory device in accordance with example embodiments.

FIG. 9 is a circuit diagram illustrating a read operation of a three-dimensional resistive memory device in accordance with example embodiments. The read operation of reading data from the programmed memory cell MC2_1 may be illustrated.

Referring to FIG. 9, a second word line WL2 connected to the memory cell MC2_1 to be read (hereinafter, referred to as a selected word line) may be disabled. The enable voltage may be applied to remaining word lines WL1 and WL3~WL5 (hereinafter, referred to as non-selected word line). A read voltage and a read current Ir may be applied to a selected bit line BL1 connected with the memory cell MC2_1 to be read. A resistance of the variable resistor VR is not changed by the read current Ir.

The switching elements SW of the memory cells connected with the non-selected word lines WL1 and WL3~WL5 may be turned-on by the enable voltage. However, the memory cells MC2_1~MC2_8 connected to the selected word line WL2 may be turned-off.

Similar to the write operation, the read voltage and the read current Ir transmitted through the switching elements SW of the memory cells MC5_1, MC4_1, and MC3_1 connected between the selected bit line BL1 and the non-selected word lines WL3~WL5. Meanwhile, because the switching element SW of the memory cell MC2_1 connected between the selected bit line BL1 and the selected word line WL2 may be turned-off, the read current Ir may flow through the variable resistor VR having a resistance lower than the off-resistance of switching element SW.

While the read current Ir flows through the programmed (or written) variable resistor VR, a current level of the read current Ir may be changed. A read current Ir' passing through the programmed (or written) variable resistor VR may be transmitted to a sense amplifier of the control circuit block. The sense amplifier may determine the resistance state of the variable resistor VR from the read current Ir'.

Figure 10A:
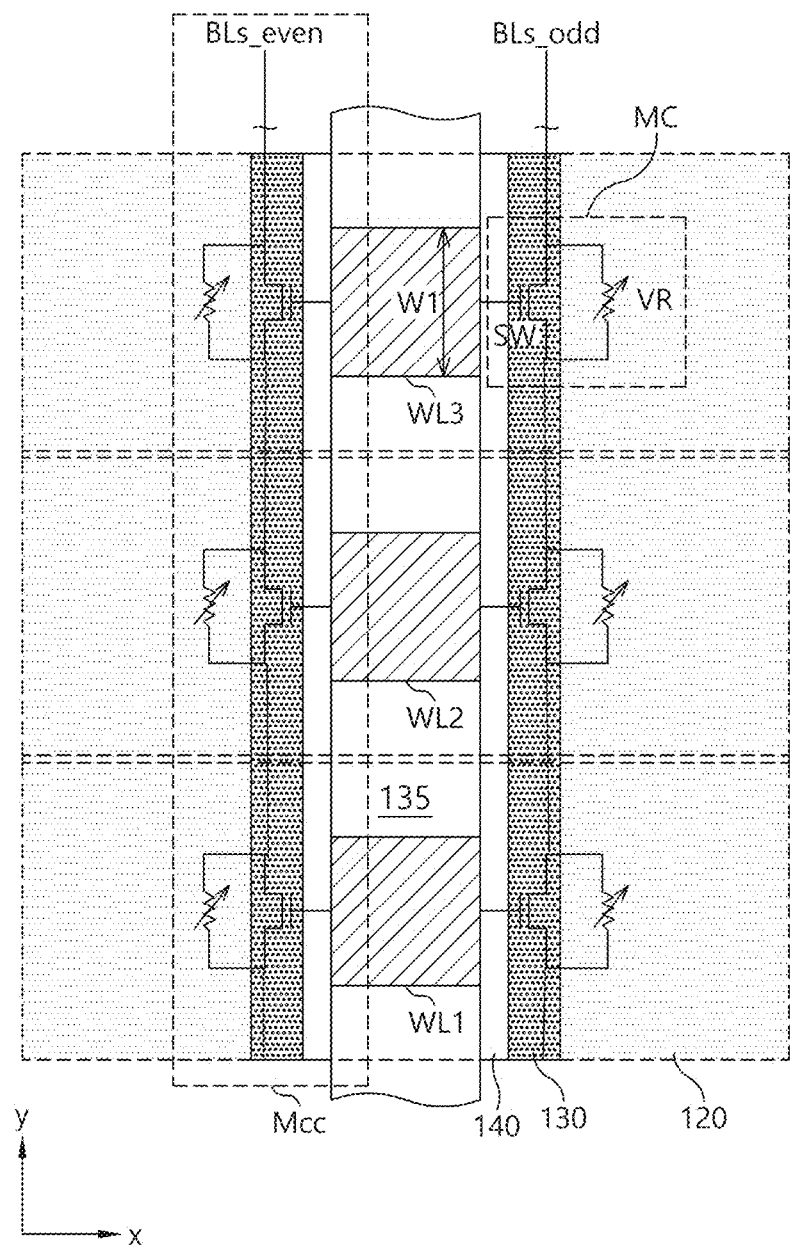
FIG. 10A is a plan view illustrating a three-dimensional resistive memory device with a word line having a first width in accordance with example embodiments.
Figure 10B:
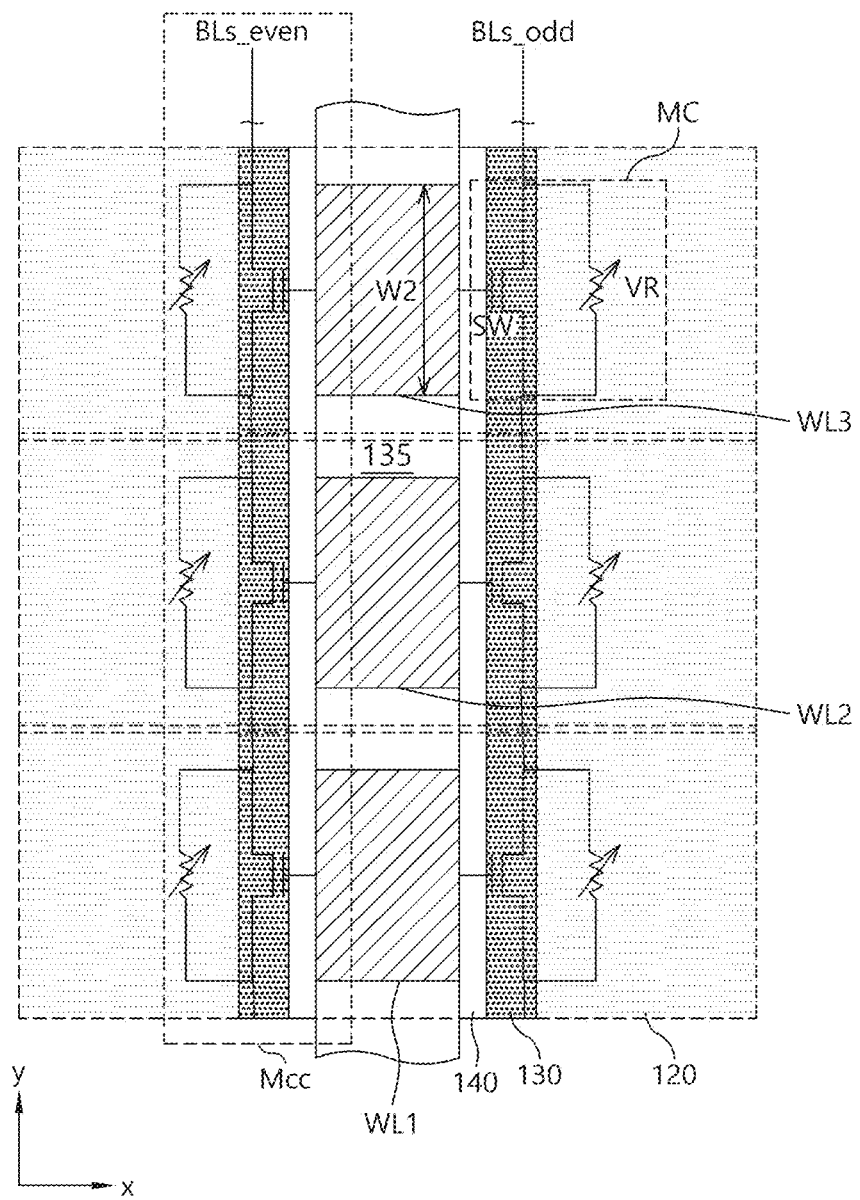
FIG. 10B is a plan view illustrating a three-dimensional resistive memory device with a word line having a second width in accordance with example embodiments.
Figure 11:
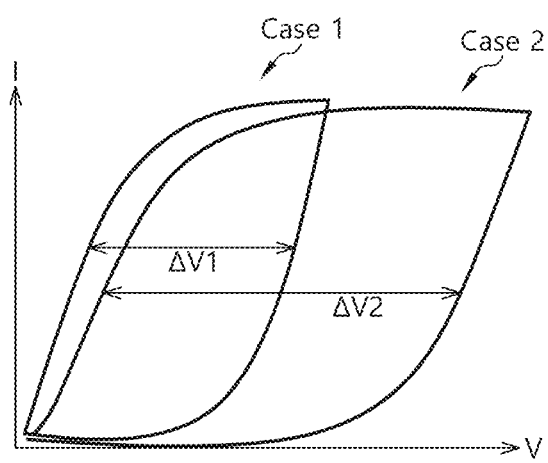
FIG. 11 is a graph showing a current-voltage a three-dimensional resistive memory device in FIGS. 10A and 10B.

FIG. 10A is a plan view illustrating a three-dimensional resistive memory device with a word line having a first width in accordance with example embodiments, FIG. 10B is a plan view illustrating a three-dimensional resistive memory device with a word line having a second width in accordance with example embodiments, and FIG. 11 is a graph showing a current-voltage a three-dimensional resistive memory device in FIGS. 10A and 10B.

Referring to FIGS. 10A and 10B, a threshold voltage ΔV for turning on the variable resistor VR may be changed by widths W1 and W2 of the word lines WL1~WL3.

When the widths W1 and W2 of the word lines WL1~WL3 may be increased, a length of the channel layer 130 in the switching element SW may also be extended. Further, a length of the resistive layer 120 parallelly connected to the channel layer 130 of the switching element SW, i.e., a length of the variable resistor VR may be extended, too.

As shown in FIG. 11, when the length of the variable resistor VR may be changed, the threshold voltage ΔV may also be changed. That is, the threshold voltage ΔV variable resistor VR may be increased proportional to the length of the variable resistor VR. In FIG. 11, a case 1 may represent a threshold voltage ΔV1 of the variable resistor VR in FIG. 10A and a case 2 may represent a threshold voltage ΔV2 of the variable resistor VR in FIG. 10B.

As a result, the threshold voltage ΔV of the variable resistor VR may be determined by controlling the widths W1 and W2 of the word lines WL1~WL3. In addition, the widths W1 and W2 of the word lines WL1~WL3 may be determined considering the threshold voltage ΔV.

According to example embodiments, the resistive layers in place of the word lines may be stacked. The word lines may be vertically formed. The resistive layers having a thin thickness may have variable resistors differently from the word line having a thick thickness for having a wiring resistance so that the three-dimensional resistive memory device may have a low height.

Figure 12:
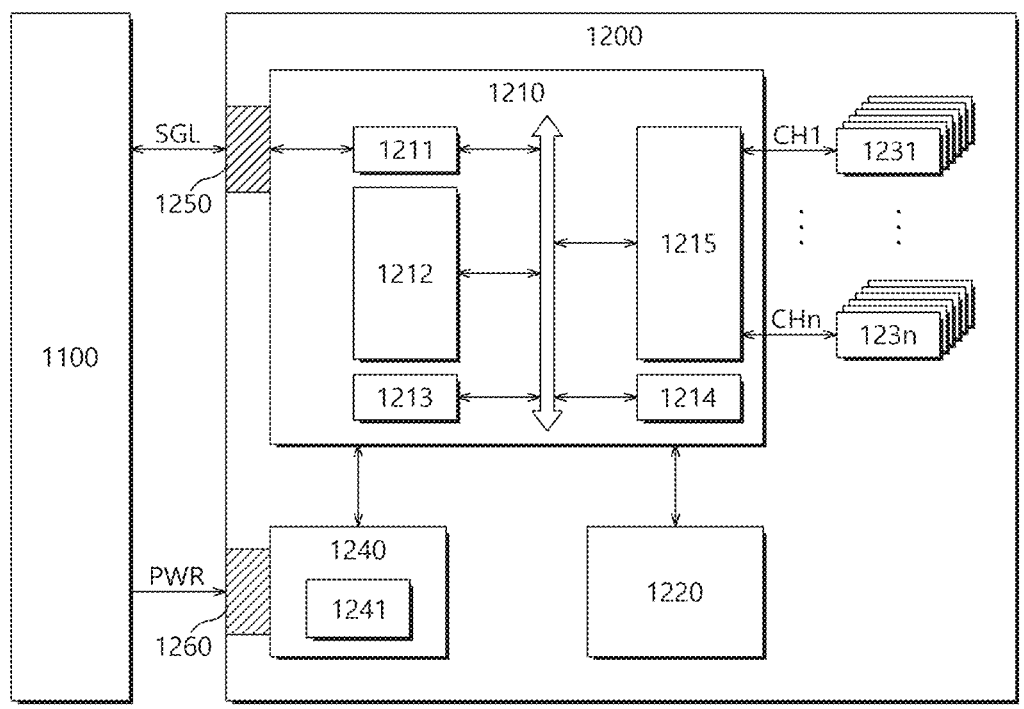
FIG. 12 is a view illustrating a data processing system including a solid state drive (SSD) in accordance with example embodiments.

FIG. 12 is a view illustrating a data processing system including a solid state drive (SSD) in accordance with example embodiments.

Referring to FIG. 12, a data-processing system 1000 may include a host device 1100 and a solid state drive (SSD) 1200.

The SSD 1200 may include a controller 1210, a buffer memory device 1220, storage memories 1231~123n, a power supply 1240, a signal connector 1250 and a power connector 1260.

The controller 1210 may be configured to control operations of the SSD 1200. The controller 1210 may include a host interface unit 1211, a control unit 1212, a random access memory 1213, an error correction code (ECC) unit 1214 and a memory interface unit 1215.

The host interface unit 1211 may transmit/receive a signal SGL to and/from the host device 1100 through the signal connector 1250. The signal SGL may include a command, an address, data, etc. The host interface unit 1211 may be configured to interface the host device 1100 and the SSD 1200 with each other in accordance with a protocol of the host device. For example, the host interface unit 1211 may be interfaced with the host device 1100 through any one of standard interface protocols such as an advanced technology attachment (ATA), a serial ATA (SATA), an external SATA (e-SATA), a small computer small interface (SCSI), a serial attached SCSI (SAS), a peripheral component interconnection (PCI), a PCI express (PCI-E), IEEE1394, a universal serial bus (USB), a secure digital (SD) card, a multimedia card (MMC), an embedded multimedia card (eMMC), a compact flash (CF) card, etc.

The control unit 1212 may be configured to analyze and process the signal SGL inputted from the host device 1100. The control unit 1212 may be configured to control background function blocks in accordance with a firmware or a software for driving the SSD 1200. The random access memory 1213 may be used as an operational memory for driving the firmware or the software.

The ECC unit 1214 may be configured to generate parity data of the data transmitted to the storage memories 1231~123n. The generated parity data and the data may be stored in the storage memories 1231~123n. The ECC unit 1214 may detect an error of the data read from the storage memories 1231~123n based on the parity data. When a detected error may be within a correctable range, the ECC unit 1214 may correct the detected error.

The memory interface unit 1215 may provide the storage memories 1231~123n with control signals such as the command, the address, etc., in accordance with the controls of the control unit 1212. The memory interface unit 1215 may transmit/receive the data to/from the storage memories 1231~123n in accordance with the controls of the control unit 1212. For example, the memory interface unit 1215 may provide the storage memories 1231~123n with the data stored in the buffer memory device 1220 or the buffer memory device 1220 with the data read from the storage memories 1231~123n.

The buffer memory device 1220 may be configured to temporarily store the data to be stored in the storage memories 1231~123n. Further, the buffer memory device 1220 may be configured to temporarily store the data read from the storage memories 1231~123n. The temporarily stored data in the buffer memory device 1220 may be transmitted to the host device 1100 or the storage memories 1231~123n in accordance with the control of the controller 1210.

The storage memories 1231~123n may be used as storage medium of the SSD 1200. Each of the storage memories 1231~123n may be connected with the controller 1210 through a plurality of channels CH1~CHn. One channel may be connected to the at least one storage memory. The at least one storage memory may be connected to a same signal bus and a same data bus.

The power supply 1240 may be configured to provide the background of the SSD 1200 with a power PWR inputted through the power connector 1260. The power supply 1240 may include an auxiliary power supply 1241. When a sudden power-off may be generated, the auxiliary power supply 1241 may provide the power PWR so as to normally stop the SSD 1200. The auxiliary power supply 1241 may include bulk capacitors.

The signal connector 1250 may include various connectors in accordance with interface types between the host device 1100 and the SSD 1200.

The power connector 1260 may include various connectors in accordance with power supply types of the host device 1100.

Figure 13:
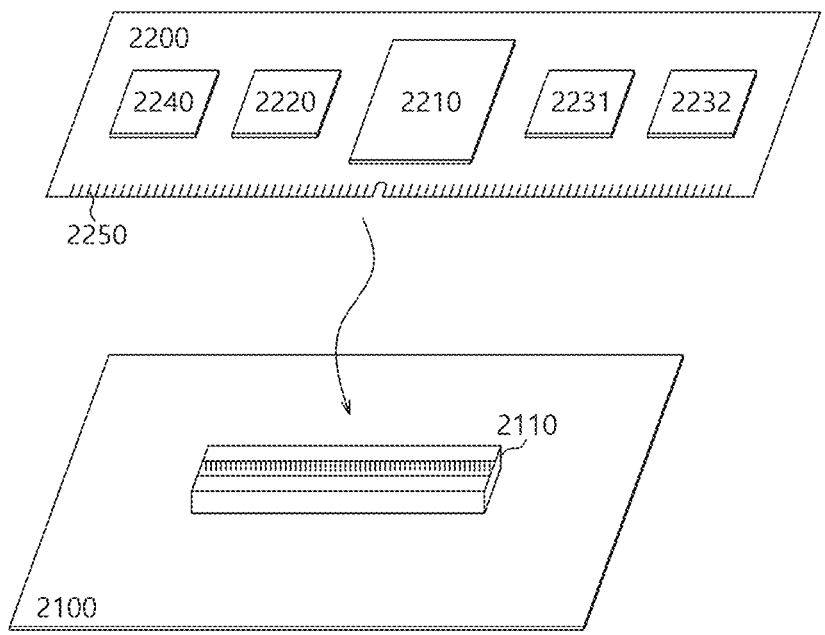
FIG. 13 is a view illustrating a data processing system including a memory system in accordance with example embodiments.

FIG. 13 is a view illustrating a data processing system including a memory system in accordance with example embodiments.

Referring to FIG. 13, a data-processing system 2000 may include a host device 2100 and a memory system 2200.

The host device 2100 may include a board such as a printed circuit board (PCB). Although not depicted in drawings, the host device 2100 may include background function blocks for performing functions of the host device 2100.

The host device 2100 may include a connection terminal 2110 such as a socket, a slot, a connector, etc. The memory system 2200 may be mounted on the connection terminals 2110.

The memory system 2200 may include a substrate such as a PCB. The memory system 2200 may be referred to as a memory module or a memory card. The memory system 2200 may include a controller 2210, a buffer memory device 2220, storage memories such as non-volatile memory devices 2231~2232, a power management integrated circuit (PMIC) 2240 and a connection terminal 2250.

The controller 2210 may be configured to control operations of the memory system 2200. The controller 2210 may have configurations substantially the same as those of the controller 1210 in FIG. 12.

The buffer memory device 2220 may be configured to temporarily store data to be stored in the storage memories 2231~2232. Further, the buffer memory device 2220 may be configured to temporarily store data read from the storage memories 2231~2232. The temporarily stored data in buffer memory device 2220 may be transmitted to the host device 2100 or the storage memories 2231~2232 in accordance with controls of the controller 2210.

The storage memories 2231~2232 may be used as a storage medium of the memory system 2200.

The PMIC 2240 may provide the background of the memory system 2200 with a power inputted through the connection terminal 2250. The PMIC 2240 may be configured to manage the power of the memory system 2200 in accordance with the control of the controller 2210.

The connection terminal 2250 may be connected to the connection terminal 2110 of the host device 2100. Signals such as a command, an address, data, etc., and a power may be transmitted between the host device 2100 and the memory system 2200 through the connection terminal 2250. The connection terminal 2250 may have various configurations in accordance with interfacing types between the host device 2100 and the memory system 2200. The connection terminal 2250 may be positioned at any one of side surfaces of the memory system 2200.

Figure 14:
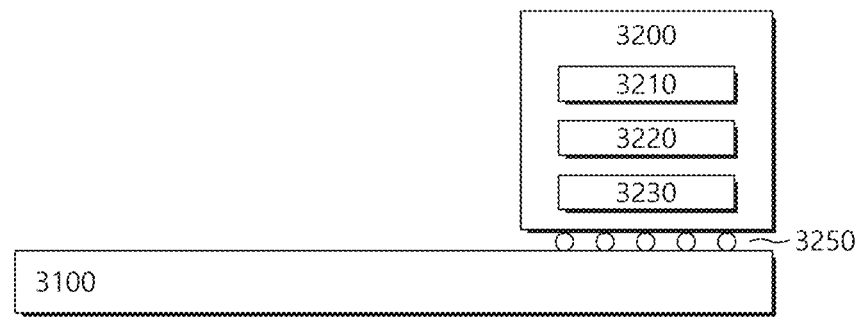
FIG. 14 is a view illustrating a data processing system including a memory system in accordance with example embodiments.

FIG. 14 is a view illustrating a data processing system including a memory system in accordance with example embodiments.

Referring to FIG. 14, a data-processing system 3000 may include a host device 3100 and a memory system 3200.

The host device 3100 may include a board such as a printed circuit board (PCB). Although not depicted in drawings, the host device 3100 may include background function blocks for performing functions of the host device 3100.

The memory system 3200 may have a surface-mounting type package. The memory system 3200 may be mounted on the host device 3100 through solder balls 3250. The memory system 3200 may include a controller 3210, a buffer memory device 3220, storage and a storage memory 3230.

The controller 3210 may be configured to control operations of the memory system 3200. The controller 3210 may have configurations substantially the same as those of the controller 1210 in FIG. 12.

The buffer memory device 3220 may be configured to temporarily store data to be stored in the storage memory 3230. Further, the buffer memory device 3220 may be configured to temporarily store data read from the storage memory 3230. The temporarily stored data in buffer memory device 3220 may be transmitted to the host device 3100 or the storage memory 3230 in accordance with controls of the controller 3210.

The storage memory 3230 may be used as a storage medium of the memory system 3200.

Figure 15:
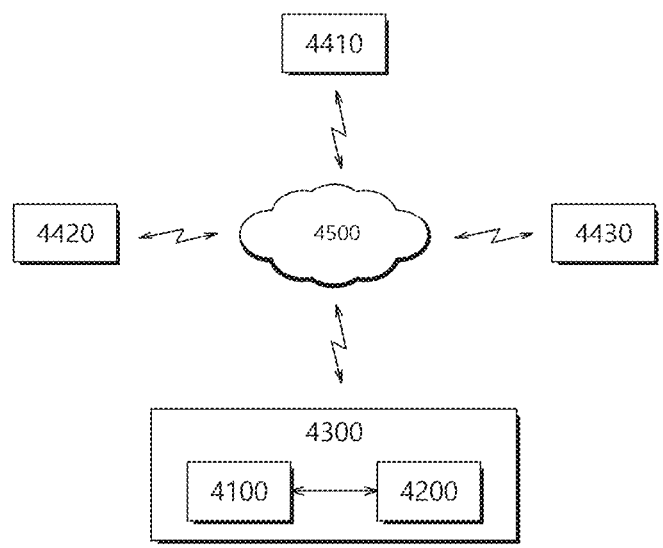
FIG. 15 is a view illustrating a network system including a memory system in accordance with example embodiments.

FIG. 15 is a view illustrating a network system including a memory system in accordance with example embodiments.

Referring to FIG. 15, a network system 4000 may include a server system 4300 and a plurality of client systems 4410~4430 connected with each other networks 4500.

The server system 4300 may be configured to provide data service in response to requests of the client systems 4410~4430. For example, the server system 4300 may store the data provided from the client systems 4410~4430. Alternatively, the server system 4300 may provide the client systems 4410~4430 with the data.

The server system 4300 may include a host device 4100 and a memory system 4200.

Figure 16:
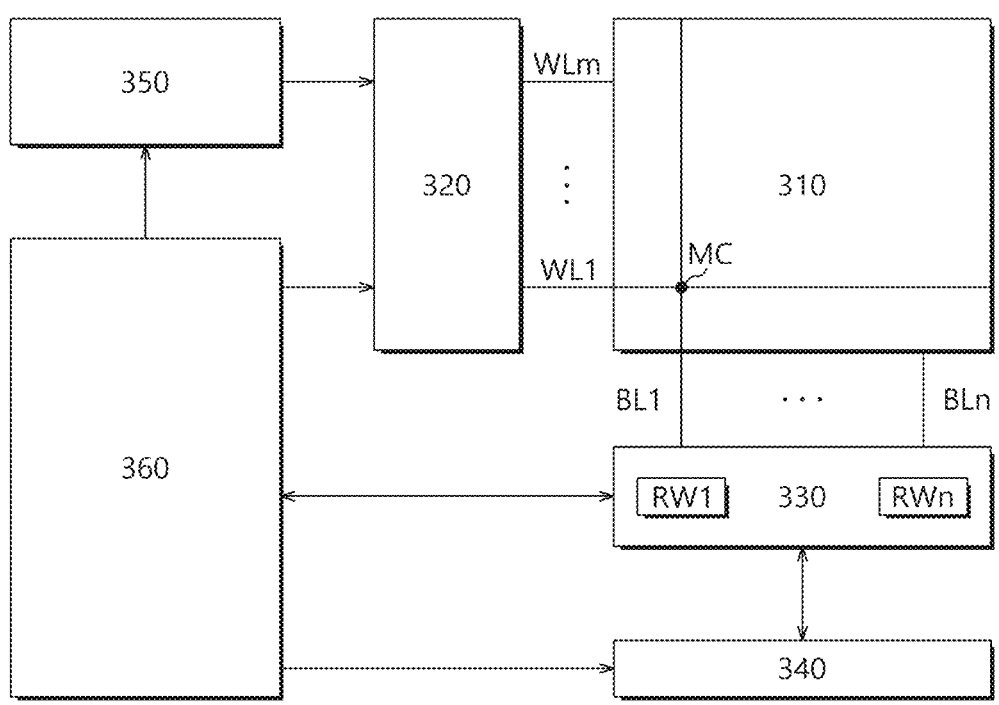
FIG. 16 is a block diagram illustrating a storage memory in a memory system in accordance with example embodiments.

FIG. 16 is a block diagram illustrating a storage memory in a memory system in accordance with example embodiments.

Referring to FIG. 16, a non-volatile memory device 300 may include a memory cell array 310, a row decoder 320, a data read/write block 330, a column decoder 340, a voltage generator 350 and a control logic 360.

The memory cell array 310 may include memory cells MC arranged at intersected points between word lines WL1~WLm and bit lines BL1~BLn.

The row decoder 320 may be connected with the memory cell array 310 through the word lines WL1~WLm. The row decoder 320 may be operated in accordance with controls of the control logic 360. The row decoder 320 may be configured to decode addresses provided from an external device. The row decoder 320 may select and drive the word lines WL1~WLm based on decoded results. For example, the row decoder 320 may provide the word lines WL1~WLm with a word line voltage provided from the voltage generator 350.

The data read/write block 330 may be connected with the memory cell array 310 through the bit lines BL1~BLn. The data read/write block 330 may include read/write block RW1~RWn corresponding to the bit lines BL1~BLn. The data read/write block 330 may be operated in accordance with controls of the control logic 360. The data read/write block 330 may be operated as a write driver or a detection amplifier in accordance with operations modes. For example, the data read/write block 330 may be operated as the write driver configured to store data provided from the external device in the memory cell array 310. Alternatively, the data read/write block 330 may be operated as the detection amplifier configured to read the data from the memory cell array 310.

The column decoder 340 may be operated in accordance with controls of the control logic 360. The row decoder 320 may be configured to decode addresses provided from an external device. The column decoder 340 may connect the read/write blocks RW1~RWn of the data read/write block 330 corresponding to the bit lines BL1~BLn with data input/output lines or data input/output buffers based on the decoded results.

The voltage generator 350 may be configured to generate voltages used for the background operation of the non-volatile memory device 300. The voltages generated by the voltage generator 350 may be applied to the memory cells of the memory cell array 310. For example, a program voltage generated at a program operation may be applied to a word line of the memory cells on which the program operation may be performed. Alternatively, an erase voltage generated at an erase operation may be applied to a well-region of the memory cells on which the erase operation may be performed. Further, a read voltage generated at a read operation may be applied to a word line of the memory cells on which the read operation may be performed.

The control logic 360 may be configured to control operations of the non-volatile memory device 300 based on control signals provided from the external device. For example, the control logic 360 may control the read operation, the write operation and the erase operation of the non-volatile memory device 300.

The above described embodiments of the present teachings are intended to illustrate and not to limit the present teachings. Various alternatives and equivalents are possible.

The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A resistive memory device comprising:
a stack structure including a plurality of resistive layers and a plurality of insulation layers being alternately stacked in a vertical direction;
a vertical word line pillar formed through the stack structure, the vertical word line pillar connected to a word line;
a gate insulation layer formed on a sidewall of the vertical word line pillar; and
a plurality of bit lines electrically connected to the plurality of resistive layers of the stack structure, respectively,
wherein the stack structure further includes:
a plurality of channel layers interposed between the gate insulation layer and the plurality of resistive layers, and each of the plurality of channel layers is electrically isolated by one of the plurality of insulation layers; and
a plurality of memory cells formed by the plurality of resistive layers and the plurality of channel layers which are positioned between the word line pillar and the plurality of bit lines, wherein each of the plurality of bit lines is not electrically connected to any other bit line.

2. The resistive memory device of claim 1, wherein the resistive layers comprise one of a chalcogenide compound, a transition metal compound, a ferroelectric, a ferromagnetic substance, and a metal oxide.

3. The resistive memory device of claim 1, wherein the channel layer comprises at least one of a doped polysilicon layer, a silicon oxide layer, a carbon nano tube layer, a Grapheme layer, a transition metal dichalcogenide monolayer (TMDC), a $MoS_2$ layer, an amorphous silicon layer and IGZO (indium-Gallium-Zinc-Oxide).

4. A resistive memory device comprising:
a semiconductor substrate; and
a memory cell array formed over the semiconductor substrate, the memory cell array including having a plurality of memory group which is arranged regions in row and column directions,
wherein each of the memory groups includes:
a stack structure including a plurality of resistive layers and a plurality of insulation layers being alternately stacked in a vertical direction being perpendicular to a surface of the semiconductor substrate;
a word line pillar formed through the stack structure, the word line pillar extending to the vertical direction;
a gate insulation layer configured to surround a sidewall of the word line pillar, wherein the word line pillar is isolated from the plurality of resistive layers of the stack structure by the gate insulation layer;
a plurality of channel layers interposed between the gate insulation layer and the plurality of resistive layers, respectively; and
a plurality of bit lines coupled to the plurality of resistive layers, respectively, wherein each of the plurality of bit lines is not electrically connected to any other bit line.

5. The resistive memory device of claim 4, wherein the resistive layer has a resistance value higher than a resistance value of the channel layer when a selection voltage is applied to the word line pillar and has a resistance value lower than the resistance value of the channel layer when the selection voltage is not applied to the word line pillar.

6. The resistive memory device of claim 4, wherein the resistive layers comprise one of a chalcogenide compound, a transition metal compound, a ferroelectric, a ferromagnetic substance, and a metal oxide.

7. The resistive memory device of claim 4, wherein the channel layer comprises at least one of a doped polysilicon layer, a silicon oxide layer, a carbon nano tube layer, a Grapheme layer, a transition metal dichalcogenide monolayer (TMDC), a $MoS_2$ layer, an amorphous silicon layer and IGZO (indium-Gallium-Zinc-Oxide).

8. A resistive memory device comprising:
a plurality of memory groups arranged in row and column directions, each of the memory groups including a word line extending in a height direction of the memory groups, a plurality of bit lines extending in the column direction and intersected with the word line, and a plurality of memory cells connected between the word line and the plurality of bit lines, wherein each of the plurality of bit lines is not electrically connected to any other bit line,
wherein each of the memory cells comprises:
a switching element configured to be turned-on in response to a voltage of the word line and a voltage of the bit line connected to the switching element; and
a variable resistor connected in parallel with the switching element and programmed (or written) when the switching element is turned-off.

9. The resistive memory device of claim 8, wherein the memory groups positioned on a same column share the bit lines.

10. The resistive memory device of claim 8, wherein a resistance of the variable resistor when the variable resistor is turned-on, is lower than an off-resistance of the switching element and higher than an on-resistance of the switching element.

* * * * *